United States Patent
Berberich et al.

(10) Patent No.: US 6,504,467 B1
(45) Date of Patent: Jan. 7, 2003

(54) SWITCH INTEGRAL IN A SEMICONDUCTOR ELEMENT

(75) Inventors: Reinhold Berberich, Frankfurt (DE); Wolfgang Bay, Frankfurt (DE)

(73) Assignee: Mannesmann VDO AG, Frankfurt (DE)

( * ) Notice: Subject to any disclaimer, the term of this patent is extended or adjusted under 35 U.S.C. 154(b) by 19 days.

(21) Appl. No.: 09/626,903

(22) Filed: Jul. 27, 2000

(30) Foreign Application Priority Data

Jul. 31, 1999 (DE) .......................... 199 36 112

(51) Int. Cl.⁷ .......................... H01H 71/18; H01H 71/14
(52) U.S. Cl. .......................... 337/139; 337/123; 337/382; 337/393
(58) Field of Search .......................... 337/297, 382, 337/393, 401, 414, 416, 158, 159, 123, 139, 140, 157

(56) References Cited

U.S. PATENT DOCUMENTS

| | | | | |
|---|---|---|---|---|
| 3,638,083 A | * | 1/1972 | Dornfeld et al. | 337/297 |
| 3,743,993 A | * | 7/1973 | Alley et al. | 337/114 |
| 3,995,246 A | * | 11/1976 | Morgan | 337/404 |
| 4,225,841 A | * | 9/1980 | Saur et al. | 337/123 |
| 4,352,082 A | * | 9/1982 | Barry et al. | 337/407 |
| 4,494,104 A | * | 1/1985 | Holmes | 337/166 |
| 4,635,091 A | | 1/1987 | Roger | |
| 4,677,412 A | | 6/1987 | Sibalis | |
| 4,727,348 A | * | 2/1988 | Okazaki | 337/403 |
| 5,084,691 A | * | 1/1992 | Lester et al. | 337/166 |
| 5,097,247 A | * | 3/1992 | Doerrwaechter | 29/623 |
| 5,612,662 A | * | 3/1997 | Drekmeier et al. | 29/623 |
| 5,652,562 A | | 7/1997 | Riley | |
| 5,770,993 A | * | 6/1998 | Miyazawa et al. | 337/142 |
| 5,777,540 A | * | 7/1998 | Dedert et al. | 257/665 |
| 5,796,152 A | * | 8/1998 | Carr et al. | 257/415 |

FOREIGN PATENT DOCUMENTS

| | | | | |
|---|---|---|---|---|
| DE | 9402484 | | 5/1994 | |
| DE | 4425307 | | 1/1996 | |
| DE | 19805785 | | 6/1999 | |
| EP | 0621738 | | 10/1994 | |
| JP | 4-237139 A | * | 8/1992 | H01L/021/60 |
| JP | 5-234495 A | * | 9/1993 | 337/241 |
| JP | 7-142672 A | * | 6/1995 | H01L/023/58 |
| JP | 8-242046 A | * | 9/1996 | H05K/001/02 |
| JP | 11-339615 A | * | 12/1999 | H01H/037/76 |

OTHER PUBLICATIONS

Patent Abstracts of Japan: 6–20574A., E–1540, Apr. 20, 1994, vol. 18, No. 221.
Patent Abstracts of Japan: 10275545 A, Oct. 13, 1998.
Patent Abstract of Japan vol. 1996, no. 7, Jul. 31, 1996 & JP 08.078611 A (NEC Corp), Mar. 22, 1996.

\* cited by examiner

Primary Examiner—Anatoly Vortman
(74) Attorney, Agent, or Firm—Martin A. Farber

(57) ABSTRACT

In a semiconductor element, in particular for switching an electrical connection, a substance which expands to a great extent when heated is arranged on the element in such a way that if the element is overheated, the electrical leads of the element are disconnected by the expanding substance or are interrupted by the melting of a conductive material with a low melting point which forms the leads.

3 Claims, 1 Drawing Sheet

SWITCH INTEGRAL IN A SEMICONDUCTOR ELEMENT

FIELD AND BACKGROUND OF THE INVENTION

The invention relates to a semiconductor element, in particular for switching an electrical connection.

Such elements are used in automotive engineering, for example, for the all-electronic switching of the onboard vehicle electrical supply. In the event of overloading, the semiconductor switches used can break down and thereby change over to an undefined low-impedance state. The semiconductor switches and, if appropriate, also connected devices and electronic circuits may thereupon exhibit malfunctions, be overheated and catch fire.

Existing fusible links cannot definitely help in the case described, since the currents necessary for them to effect disconnection are not achieved in every fault situation. Moreover, overcurrent cutoffs integrated in the semiconductor can only function as long as the semiconductor chip itself still functions entirely satisfactorily, which likewise cannot, in practice, be guaranteed for all fault situations.

SUMMARY OF THE INVENTION

The object of the present invention, therefore, is to specify a semiconductor element which is protected against the possible consequences of overloading. The intention is for the element to be able to be produced simply and inexpensively in large numbers.

This object is achieved according to the invention by virtue of the fact that a substance which expands to a great extent when heated is arranged on the element in such a way that if the element is overheated, the electrical leads of the element are disconnected by the expanding substance. In the event of overloading, a semiconductor element according to the invention is heated up to an increasing extent on account of its finite electrical resistance. The invention utilizes this overheating for triggering the protection element. The electrical leads to the element are severed, preferably torn off, by suitably arranged portions of the substance. Furthermore, due to the resulting pressure of the expanding substance, structural parts can be driven apart and utilized for interrupting the electrical connection.

A first refinement of the invention provides for the substance to be a substance which vaporizes rapidly at a predetermined limit temperature.

A further refinement of the invention provides for the substance to be a substance which swells up at a predetermined limit temperature.

Another refinement of the invention provides for the substance to expand explosively when a predetermined limit temperature is exceeded, and the substance to be arranged in such a way that the leads are disconnected on account of the explosion. A pyrotechnic material, similar to that used in airbags, can be used for this purpose.

Effective interruption of the electrical leads can be achieved by the substance being arranged between the semiconductor element and a further part in such a way that the further part and the semiconductor element are driven apart by the expanding substance, and the leads provided on the semiconductor element being routed in such a way that they are torn off by the further part that moves away. In this case, it may be provided, in particular, that the semiconductor element is coated with a layer of the substance, that said layer is covered by the further part, and that the leads provided on the element run through the layer and are fixedly connected to the further part. In this case, the further part may be a covering layer made of plastic into which the lead wires are cast. As a result of the increase in the volume of the substance, the covering layer is lifted from the semiconductor element and the lead wires are torn off.

A different solution to the problem can be achieved by the electrical connection to the element being effected by means of a conductive material with a low melting point, which material is arranged on the element in such a way that the connection is severed by the melting of the material if the element is overheated. In this case, the heat is supplied from the overheated semiconductor element itself. A conventional fusible link cannot be used for this purpose since the currents that occur do not exceed the current intensities that usually crop up in the system.

Exemplary embodiments of the invention are illustrated in the drawing using a number of figures and are explained in more detail in the description below. In the figures of the drawings.

BRIEF DESCRIPTION OF THE DRAWINGS

Identical parts are provided with identical reference symbols in the figures.

Figure 1:
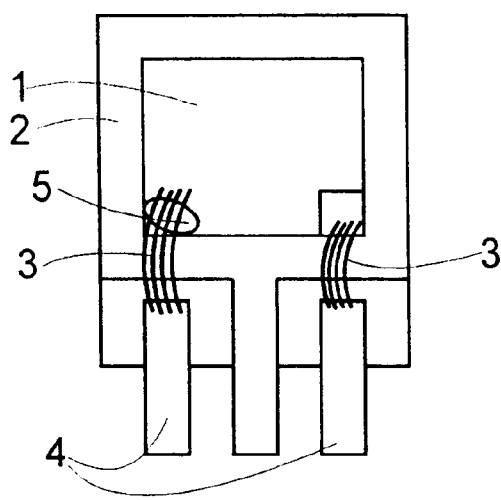
FIG. 1 shows a semiconductor element provided with an explosive charge.

The element 1 shown in FIG. 1 is a semiconductor switch provided with overload protection according to the invention. The element 1 is mounted on a support 2 and connected via wires 3 to the electrical connections 4. An explosive substance 5 is arranged below the wires 3 of one connection, which substance responds in the event of the element 1 being overheated and tears off the wires 3, with the result that structural parts which are connected downstream do not incur any damage.

Figure 2:
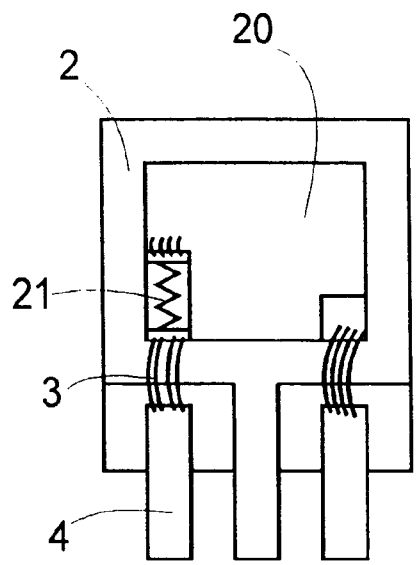
FIG. 2 shows a semiconductor element provided with a fusible link.

FIG. 2 shows an element 20 protected by a fusible link 21. If the element 20 is overheated, the fuse wire 21 melts due to the heat of the element 20 and thus interrupts the supply of current.

Figure 3:
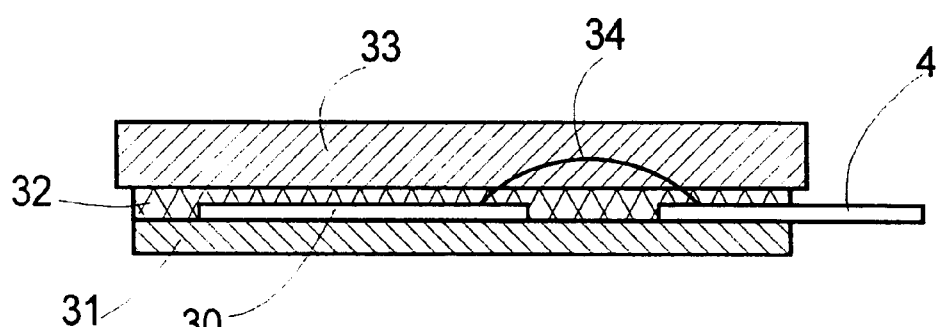
FIG. 3 shows a semiconductor element provided with a substance having a low vaporization point and with a fixed covering layer.

Finally, FIG. 3 shows another semiconductor element 30 in side view. The element 30 is applied on a support 31. Above it there is a layer 32 of a substance which vaporizes when the element 30 is overheated. This layer 32 is provided with a fixed covering layer 33 serving as a covering. The connecting wires 34 are routed in an arc and cast into the covering layer 33. If the element 30 is overheated, the substance 32 vaporizes and forces the covering layer 33 upward, as a result of which the connecting wires 34 tear off.

We claim:

1. A semiconductor element, in particular for switching an electrical connection, wherein a substance (5, 32) which swells-up when heated is arranged on the element (1, 20, 30) such that if the element (1, 20, 30) is overheated, electrical leads (3, 34) of the element are disconnected by the expanding substance (5, 32), wherein said substance expands explosively (5) when a predetermined limit temperature is exceeded, and wherein the substance is arranged such that the leads (3) are disconnected due to the explosion.

2. A semiconductor element, in particular for switching an electrical connection, wherein a substance (5, 32) which swells-up when heated is arranged on the element (1, 20, 30) such that if the element (1, 20, 30) is overheated, electrical leads (3, 34) of the element are disconnected by the expanding substance (5, 32), wherein the substance is arranged between the semiconductor element (30) and a further part (33) such that the further part (33) and the semiconductor element (30) are driven apart by the expanding substance (32), and wherein the leads (34) provided on the semiconductor element (30) are routed such that they are torn off by the further part (33) that moves away.

3. The semiconductor element as claimed in claim 2, wherein the semiconductor element is coated with a layer (32) of the substance, wherein said layer is covered by the further part (33), and wherein the leads (34) provided on the element run through the layer (32) and are fixedly connected to the further part (33).

* * * * *